United States Patent [19]
Funk et al.

[11] Patent Number: 6,134,117
[45] Date of Patent: Oct. 17, 2000

[54] METHOD FOR HIGH RESOLUTION TRIMMING OF PCB COMPONENTS

[75] Inventors: John David Funk, Galveston; Paul John Dobosz, Noblesville, both of Ind.

[73] Assignee: Delphi Technologies, Inc., Troy, Mich.

[21] Appl. No.: 09/292,916

[22] Filed: Apr. 16, 1999

[51] Int. Cl.$^7$ ...................................................... H05K 1/18
[52] U.S. Cl. .................... 361/760; 361/793; 361/765; 361/766; 174/250; 174/255; 174/260; 228/180.21; 228/180.22; 333/185; 310/318; 331/73; 331/76
[58] Field of Search .................... 361/760, 793, 361/762–766; 174/250, 255, 258, 260; 228/180.21, 180.22; 333/185; 310/318; 331/73, 76

[56] References Cited

U.S. PATENT DOCUMENTS

| | | | |
|---|---|---|---|
| 3,689,810 | 9/1972 | Walles | 361/305 |
| 4,515,304 | 5/1985 | Berger | 228/136 |
| 5,466,892 | 11/1995 | Howard et al. | 174/261 |
| 5,509,599 | 4/1996 | Laue | 228/180.21 |
| 5,812,031 | 9/1998 | Saotome et al. | 331/57 |
| 5,929,729 | 7/1999 | Swarup | 333/246 |
| 5,941,447 | 8/1999 | Chu et al. | 228/180.21 |
| 6,021,050 | 2/2000 | Ehman et al. | 361/793 |

*Primary Examiner*—Jeffrey Gaffin
*Assistant Examiner*—David Foster
*Attorney, Agent, or Firm*—Jimmy L. Funke

[57] ABSTRACT

A method for high resolution trimming of PCB components, such as capacitors, inductors, transmission lines, transformers, antennas, resistors, etc. The method includes drilling or milling the PCB to effect the electrical characteristics of the component. The actual component can be machined to reduce the size of the component, or electrical connections to the component can be severed. The method can be used to set the capacitance of a tuning capacitor for an oscillator circuit. The tuning capacitor is etched out of the conductive planes on opposing sides of the PCB. The dielectric substrate of the PCB acts as the dielectric for the capacitor. The conductive planes are also etched to define conductive traces and connection pads suitable for surface mounting and electrically connecting the various electrical components on the PCB. The area of the selectively etched capacitive plates has a capacitance that is predetermined. By reducing the area of the capacitive plates, the capacitance is reduced, affecting the tuning. By knowing how much material to remove to get a certain capacitance, the capacitor can be selectively reduced to obtain the desired output frequency, or the capacitor can be selectively reduced until the desired output frequency is obtained.

6 Claims, 5 Drawing Sheets

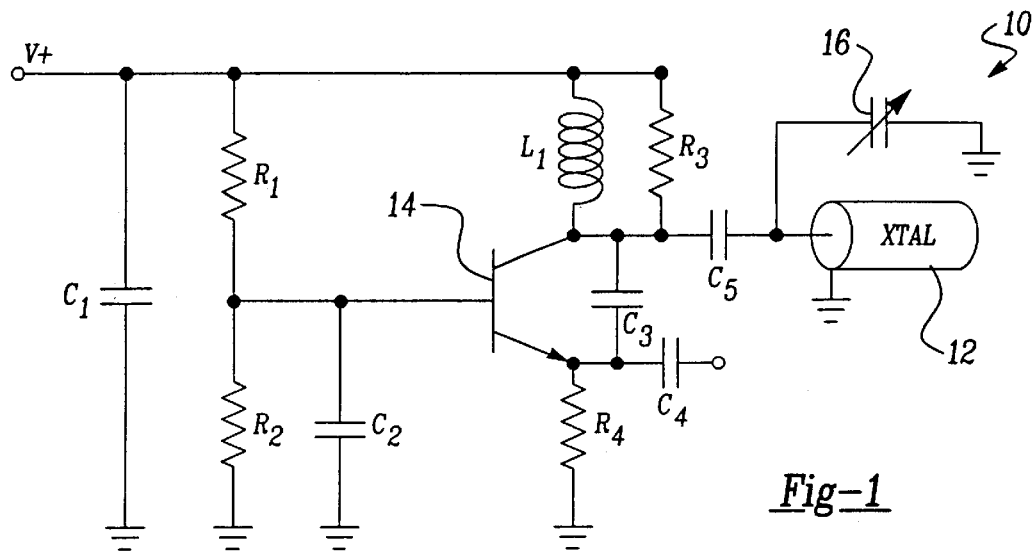
*Fig-1*
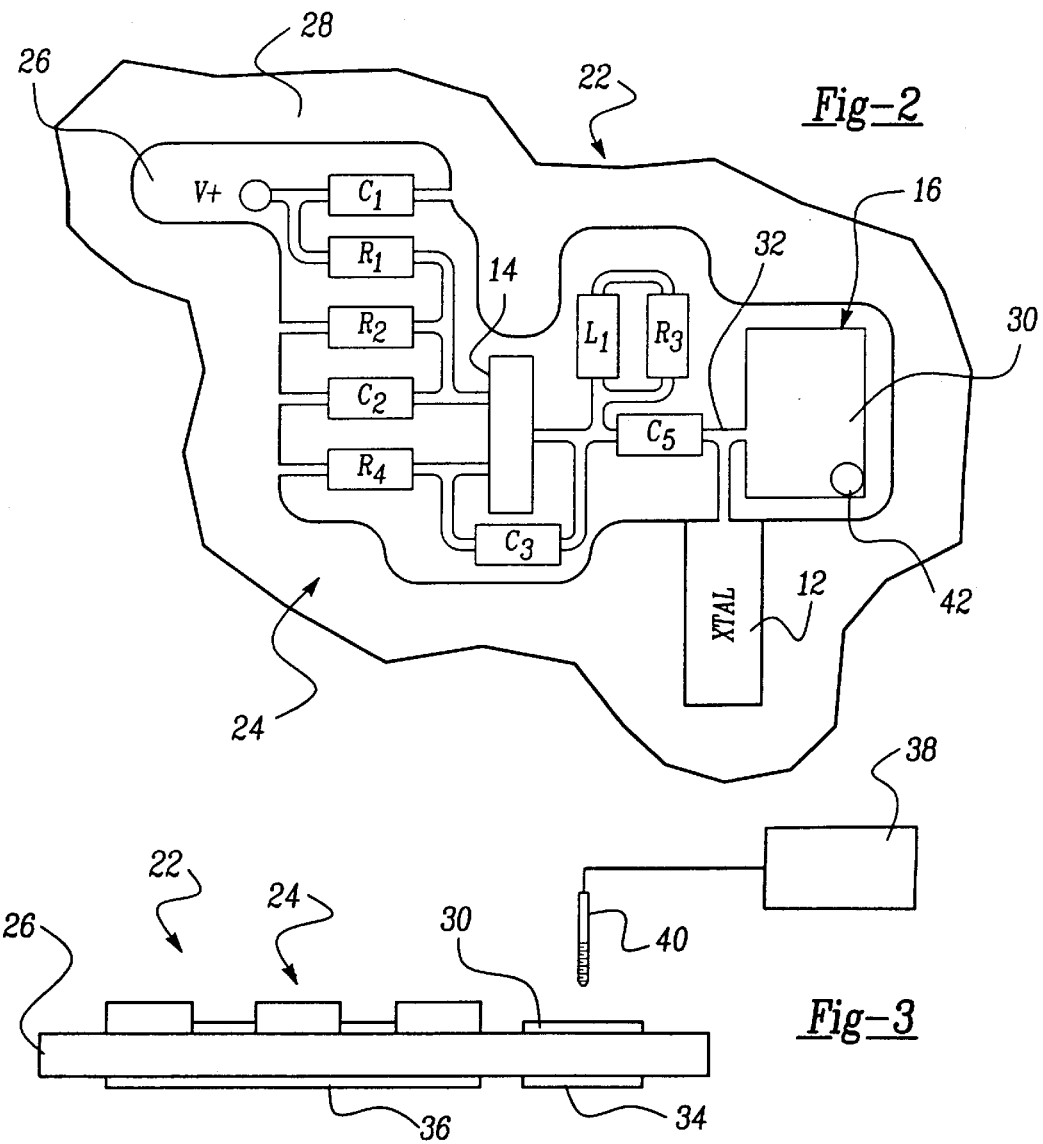
*Fig-2*
*Fig-3*

METHOD FOR HIGH RESOLUTION TRIMMING OF PCB COMPONENTS

BACKGROUND OF THE INVENTION

1. Field of the Invention

This invention relates generally to a method of trimming printed circuit board components, and, more particularly, to a method of changing the capacitance of a tuning capacitor used to tune the resonant output frequency of an oscillator circuit by removing material from the capacitor, where removing the material includes drilling or milling into a printed circuit board.

2. Discussion of the Related Art

Certain circuits must be accurately tuned to a particular output frequency during manufacture. For example, electronic tolling transponders must output a signal at an exact center frequency, such as 915 MHz, so that they perform their intended function. Other types of tuned circuits for other applications also must be tuned to a desirable output frequency for proper operation.

FIG. 1 is a schematic diagram of a representative oscillator circuit 10 that provides an output signal at a certain frequency, and is the type that can be used in a transponder. The circuit 10 includes a co-axial resonator 12 that primarily determines the oscillating frequency. The resonator 12 can be any suitable resonating device know in the art for the purposes described herein, such as a TEM or co-axial resonator. The oscillating signal appears at the collector terminal of an amplifying transistor 14 and is coupled to the resonator 12 through a coupling capacitor $C_5$. The transistor 14 amplifies and sustains the oscillator signal and provides the buffered output frequency through the emitter terminal of the transistor 14 and an output capacitor $C_4$. The output signal is fed back to the base terminal of the transistor 14 through the collector-to-base internal capacitance. Capacitor $C_3$ swamps out the effects of the collector-to-emitter capacitance of the transistor 14.

A DC voltage potential is applied to a voltage divider network made up of resistors $R_1$ and $R_2$. The voltage divided DC signal is applied to the base terminal of the transistor 14 to bias it into the active region. Capacitors $C_1$ and $C_2$ provide AC filtering and noise reduction, and inductor $L_1$ provides DC blocking to the power supply. Each of the components that are discussed above are typically discrete components that are surface mounted on a printed circuit board (PCB), such as a double-clad FR-4 circuit board, known in the art. Circuit boards of this type generally start out as opposing copper planes deposited on opposite sides of a fiberglass substrate, and all of the copper patterns are made by etching away all of the unused copper.

Because the natural oscillation frequency of the inexpensive resonators used in these types of devices can be affected by the circuit configuration and loading by the transistor and other circuit elements, the circuit 10 must be tuned to the desirable frequency during manufacture of the transponder. For this purpose, a tuning capacitor 16 is connected to the oscillation output of the resonator 12 to tune the output to the desired frequency. The capacitance of the capacitor 16 acts to reduce the output frequency of the resonator 12. When the capacitance of the capacitor 16 goes up, the frequency of the output signal goes down, and vice versa. Therefore, by setting the capacitance of the capacitor 16 to a certain value, the frequency output can be accurately tuned.

To provide capacitance tuning of this type, the resonator 12 is selected to have an oscillation frequency greater than the desired output frequency. Charts, look-up tables, and experimental data can be provided to identify the necessary tuning capacitance to reduce the frequency of the measured output of the untrimmed circuit 10 to the desired output when it is being manufactured. Various techniques are known in the art for setting the capacitance of the tuning capacitor 16 to provide the necessary capacitance. One technique includes adding additional capacitors in parallel as discrete components to reduce the frequency. However, readily available capacitors generally only come in minimum sizes of 0.5 pf, 1.0 pf, 1.2 pf, etc. Tuning tolerances sometimes require the added capacitance to be in increments of 0.1 pf or even 0.05 pf to attain the desired output frequency.

To overcome the problem of the limited sizes of available capacitors, a laser trimming technique has been developed in the art the reduce the actual plate size of a tuning capacitor so that it provides the desired capacitance for the proper resonant frequency. Specialized laser trimming capacitors are available as discrete components that can be trimmed by a laser beam to reduce the capacitor plate size, and thus, its capacitance. Once again, charts or look-up tables can be provided to identify how much material needs to be removed, to provide a certain capacitance. In one specific laser trimming example, the laser beam reduces the size of only a top plate of the capacitor to achieve the desired tuning capacitance.

Laser trimming is an effective way of altering the capacitance of a tuning capacitor for the purposes described above. However, laser trimming machines are expensive (approximately $250 K and up) and take up valuable space in the manufacturing facility. Improvements can thus be made in the art to provide capacitor trimming at a reduced expense. It is an object of the present invention to provide such improvements.

SUMMARY OF THE INVENTION

In accordance with the teachings of the present invention, a method for high resolution trimming of PCB components, such as capacitors, inductors, transmission lines, antennas, resistors, transformers, etc., is disclosed. The PCB component is made out of the conductive planes of the PCB. The trimming process includes using a method of PCB material removal, such as drilling or milling of the PCB, to affect the electrical characteristics of the component. The actual component is machined to reduce the size of the component, or remove dielectric material between or around the PCB component, or sever electrical connections to the component and other components, to affect the electrical characteristics of the circuit.

In one embodiment, the method is used to set the capacitance of a tuning capacitor for an oscillator circuit. Each plate of the tuning capacitor is etched out of the conductive planes on opposing sides of the PCB. The dielectric substrate of the PCB acts as the dielectric for the capacitor. The conductive planes are also etched to define conductive traces and connection pads suitable for surface mounting and electrically connecting the various electrical components on the PCB. The area of the selectively etched capacitive plates has a capacitance that is predetermined. By reducing the area of the capacitive plates, the capacitance is reduced, affecting the tuning. By knowing how much material to remove to get a certain capacitance, the capacitor can be selectively reduced to obtain the desired output frequency, or alternatively, material can be removed in an iterative material removal and test sequence until the desired frequency is obtained.

Additional objects, advantages, and features of the present invention will become apparent from the following description and appended claims, taken in conjunction with the accompanying drawings.

BRIEF DESCRIPTION OF THE DRAWINGS

FIG. 1 is a schematic diagram of an oscillator circuit including a tuning capacitor, according to the invention;

FIG. 2 is a top view of a PCB including surface mounted electrical components and a tuning capacitor, according to an embodiment of the present invention;

FIG. 3 is a side view of the circuit board shown in FIG. 2 including a drilling device for reducing the size of the tuning capacitor;

DETAILED DESCRIPTION OF THE PREFERRED EMBODIMENTS

Figure 4:
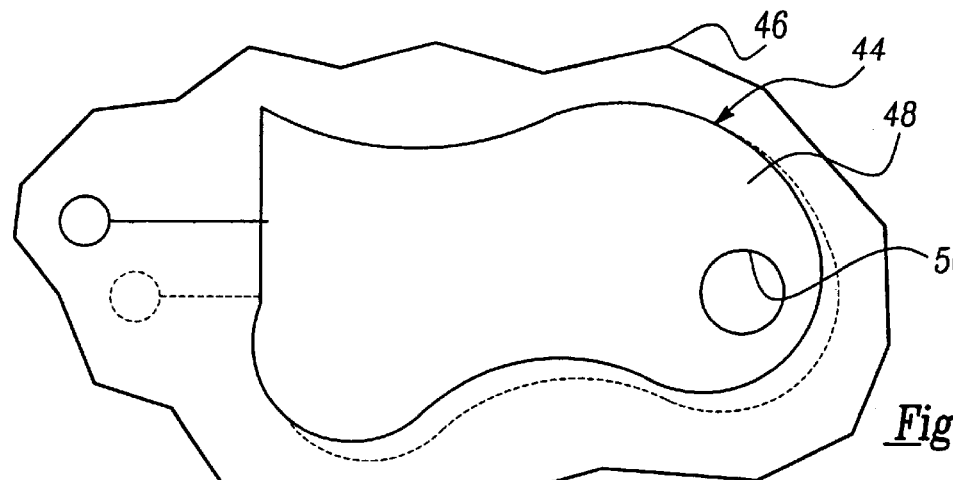
FIG. 4 shows an irregularly-shaped capacitor printed on a PCB including a hole machined through the capacitor and PCB to reduce its capacitance.

The following discussion of the preferred embodiments including a specialized tuning capacitor and method of trimming same, is merely exemplary in nature, and is in know way intended to limit the invention or its applications or uses. For example, the trimming process of the invention can be extended to other PCB components, such as inductors, transmission lines, resistors, antennas, transformers etc., and used in a variety of circuit functions.

FIG. 2 is a top view of a PCB 22 that mounts and electrically connects a plurality of surface mounted discrete electrical components 24 that represent the various circuit components of the oscillator circuit 10, discussed above. Some of the components of the circuit 10 are identified by the same reference numeral. The PCB 22 can be any suitable circuit board substrate material known in the art, such as an FR-4 or G10 circuit board. These types of circuit boards include a dielectric substrate 26 and conductive planes deposited on opposite sides of the substrate 26. The conductive planes are usually copper. The conductive planes are etched by a suitable etching process to define conductive traces and connection pads to electrically interconnect the various components in a desired manner. A remaining portion of the top conductive plane is a ground plane 28 in this embodiment.

According to the invention, the tuning capacitor 16 is formed by etching out one or both of the opposing sections of the conductive planes and using the substrate 26 as the dielectric between the plates. In FIG. 2, a top plate 30 of the tuning capacitor 16 is shown, and is connected to a conductive trace 32. An opposing bottom plate 34 (see FIG. 3) of the capacitor 16 would be electrically connected to a ground plane 36. In an alternate embodiment, the capacitor 16 can be a pair of separated conductive traces on the same side of the substrate 26, where the capacitance is adjusted by trimming the end(s) of one or both of the traces, or the dielectric (substrate) material between the traces.

Measurements can be made, for example, by an impedance analyzer, of the conductive properties of the ground planes and the dielectric properties and thickness of the substrate 26 to determine the capacitance for different sized plates. Based on these measurements, calculations provide knowledge of how much material to remove from the capacitor plates to reduce the capacitance by a known amount. It has been determined that each capacitor plate 30 and 34 needs to be about 0.238" square for a particular resonator on an FR-4 PCB to get a capacitance of about 1.2 pf initially for 915 MHz. The capacitor 16 is then drilled out until 915 MHz is obtained. This size allows the capacitor 16 to be treated as a lumped element since the physical size is less than $\frac{1}{10}$ the wavelength of the signal at 915 MHz.

FIG. 3 is a side view of the circuit board 22 positioned relative to a milling or drilling machine 38 including a drilling bit 40. The drilling machine 38 is used to drill through the top plate 30, the substrate 26 and the bottom plate 34 of the capacitor 16 to reduce its size, and thus its capacitance. The machine 38 can perform any type of drilling, milling, punching, shearing, routing, etc. of the capacitor 16 consistent with the discussion herein. The material of the capacitor 16 is selectively removed from the capacitor 16 to provide high resolution trimming to accurately control the reduction in capacitance. Multiple holes can be drilled or different bit sizes can be used for the bit 40 to remove less or more material during each drilling process. Further, only the top plate 30 or only the substrate 26 can be machined for capacitive tuning. FIG. 2 shows part of the plate 30 removed at location 42 to reduce the capacitance of the capacitor 16, where the location 42 is distant from the conductive trace 32 connected to the plate 30. This location provides the best area to begin removing the material. Pre-punched pilot holes (not shown) can be placed on the PCB 22 to improve the accuracy and repeatability of automatic and hand-held drills.

Trimming a tuning capacitor, as described above, is one electrical component that can benefit from the invention. Any capacitor formed from a PCB can also have its capacitance changed by this method. Irregularly shaped capacitors can also be machined to remove part of one or both conductive plates, or where the trace configuration allows, remove just the dielectric material between the traces, for purposes of reducing the capacitance. FIG. 4 shows a capacitor 44 formed from a PCB 46 having an irregularly-shaped plate 48. A hole 50 has been drilled through the plate 48 to change the capacitance of the capacitor 44. Any suitable shape for a capacitor can be formed in the conductive planes of the PCB, including lines, grids and mesh.

Figure 5:
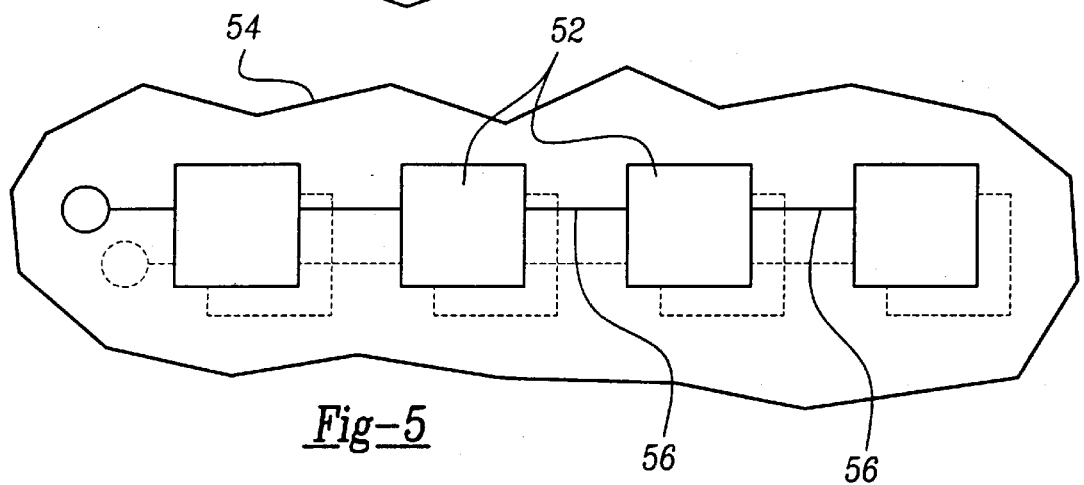
FIG. 5 shows a series of capacitors printed on a PCB that can be separated by drilling holes through connecting traces on the PCB.

FIG. 5 shows a series of capacitors 52 formed from separate sections of a PCB 54 and connected by electrical traces 56. By drilling into or through the PCB 54 at one of the traces 56, the following capacitors 52 can be eliminated from the circuit resulting in a smaller capacitance. Additionally, multilayer capacitors can be trimmed in the same manner where the capacitor is formed by two or more layers of the PCB.

Figure 6:
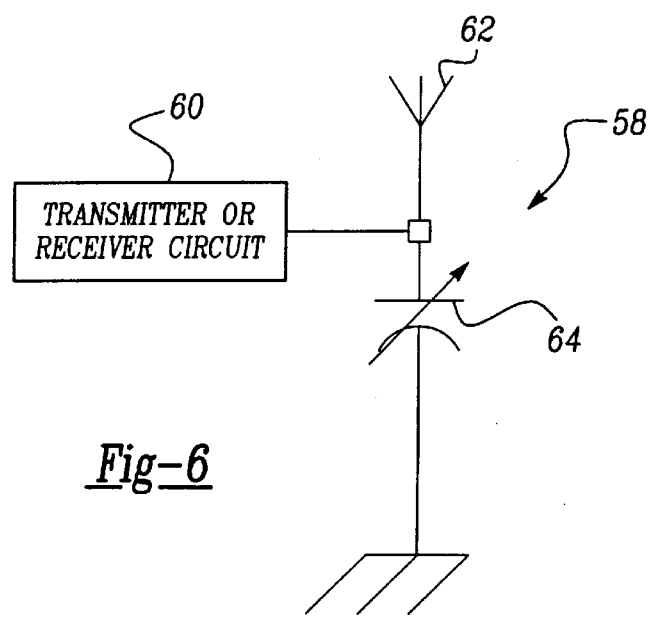
FIG. 6 shows a transponder antenna printed on a PCB that can be trimmed by trimming an antenna capacitor by the process of the invention.

FIG. 6 shows a transponder system 58, or other such transceiver, including a transmitter/receiver circuit 60, a transponder antenna 62 and a PCB trimmable capacitor 64 connected to the antenna 62. The capacitor 64 can be trimmed as described above to adjust the receive sensitivity or transmit power of the system 58.

Figure 7A:
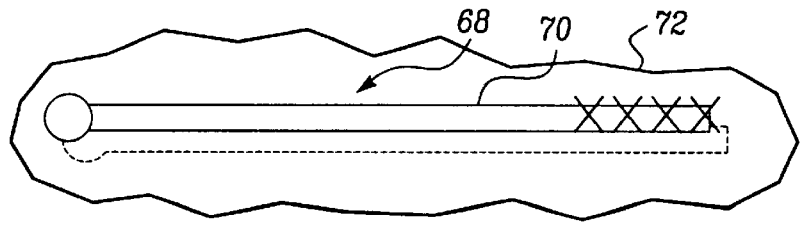
FIGS. 7(a)–7(c) show three transmission lines printed on a PCB that can be shortened or lengthened by drilling through the PCB at certain locations.
Figure 7B:
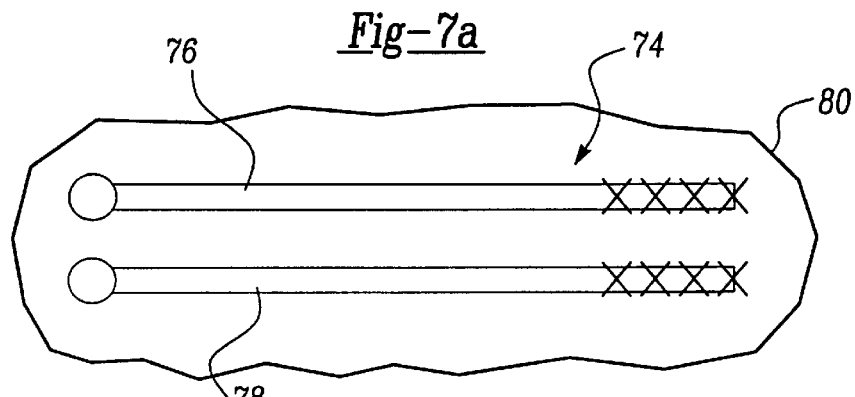
Figure 7C:
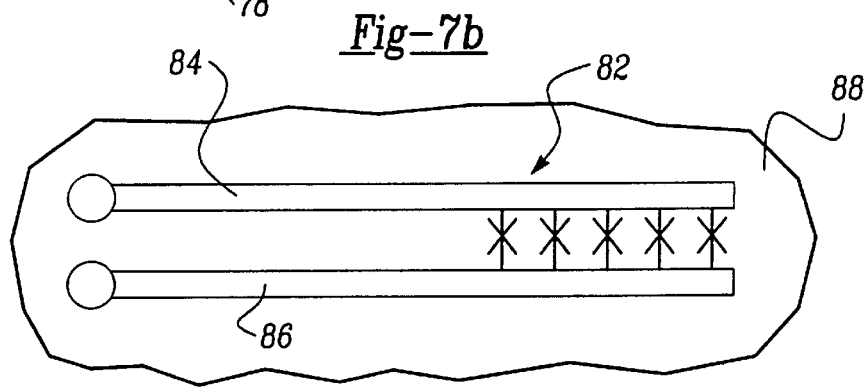

Other reactive, resistive, and conductive PCB components can also benefit from the process of the invention. FIGS. 7(a)–7(c) show three separate transmission lines formed by conductive traces on a PCB. Particularly, FIG. 7(a) shows an open transmission line 68 formed by conductive traces 70 on opposite sides of a PCB 72. FIG. 7(b) shows an open transmission line 74 formed by separated conductive traces 76 and 78 on the same side of a PCB 80. FIG. 7(c) shows a shorted transmission line 82 formed by separated conductive traces 84 and 86 on the same side of a PCB 88. By drilling into or through the PCBs 72 and 80 at the locations marked "X" opposite the sending end, the transmission lines 68 and 74 will be shortened resulting in a change in the reactance value of the line. By drilling into or through the PCB 88 at the locations marked "X" from left to right, the transmission line 82 will be lengthened, also effecting its reactance value. Whether the change causes more or less inductance or capacitance depends on the length of the transmission line, the operating frequency and substrate permittivity.

Figure 8:
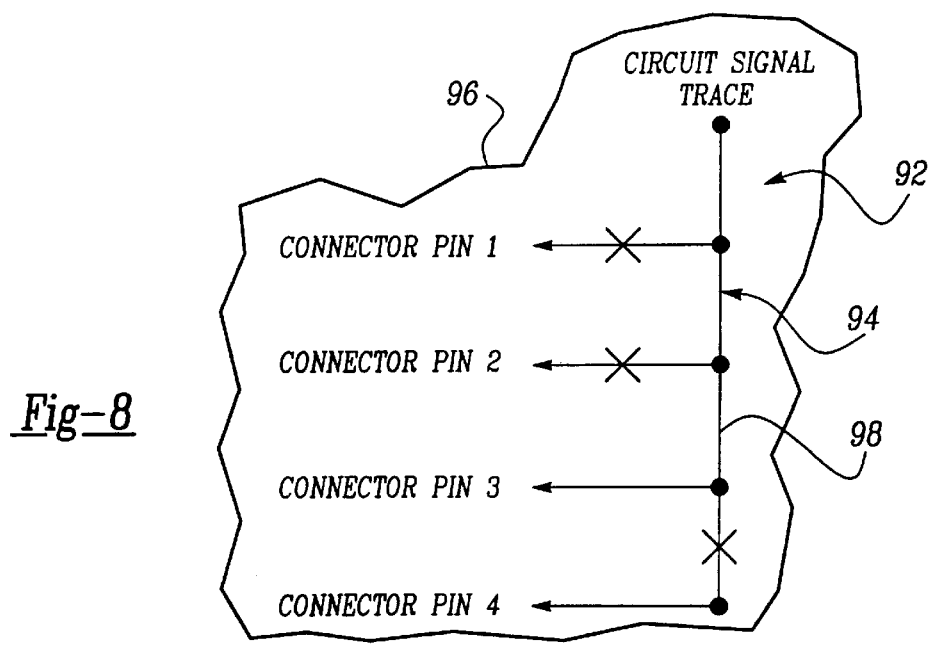
FIG. 8 shows a connectivity matrix printed on a PCB where traces of the matrix can be removed by drilling through the PCB at certain locations.
Figure 9A:
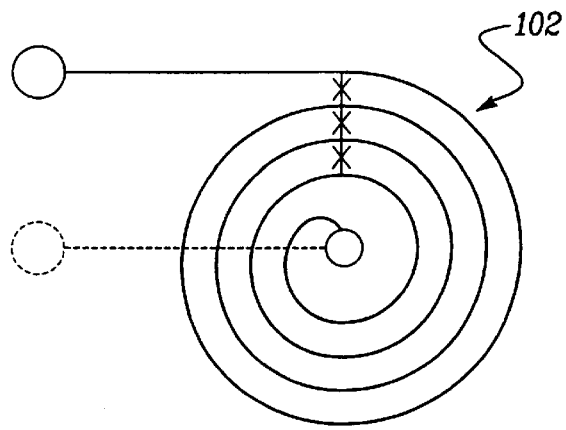
FIGS. 9(a)–9(d) show several printed traces on a PCB that represent antennas, inductors or resistors, that can be electrically altered by drilling into or through the PCB at certain locations.
Figure 9B:
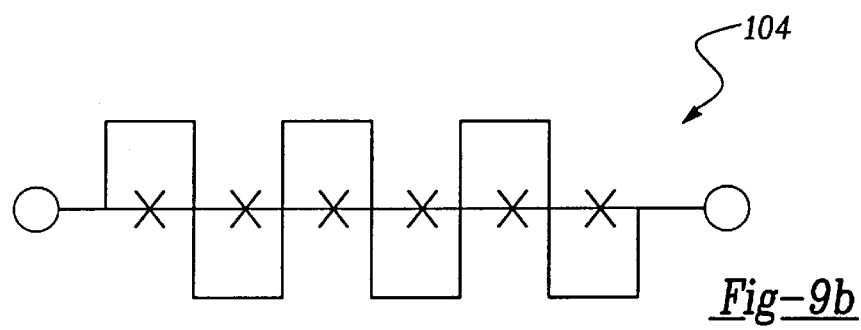
Figure 9C:
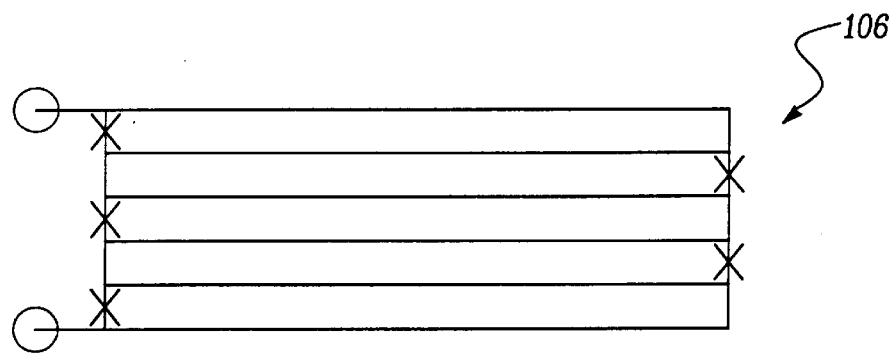
Figure 9D:
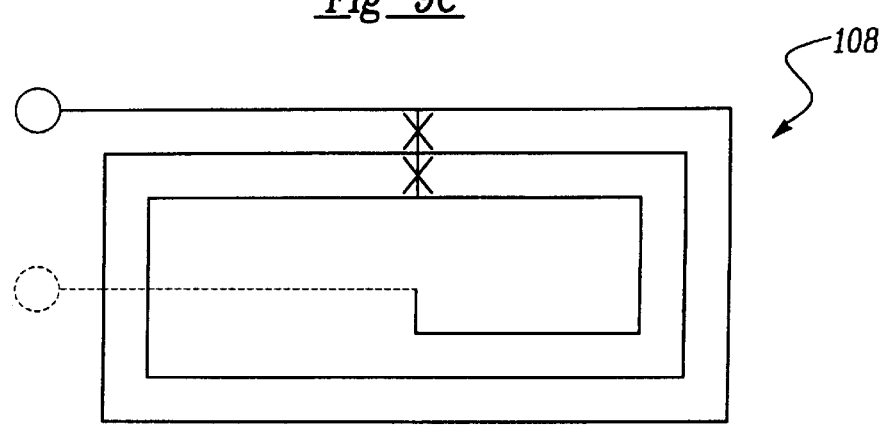

FIG. 8 shows a connectivity matrix 92 defined by a series of conductive traces 94 on a PCB 96. A common signal trace 98 is connected to four connector pins 1–4. By drilling into or through the PCB 96 at the locations marked with the "X", the connector pins 1, 2 and 4 are disconnected from the signal trace 98.

FIGS. 9(a)–9(d) show traces 102, 104, 106 and 108, respectively, of various shapes that are printed on a PCB. The traces 102–108 can be printed inductors, antennas or resistors depending on the application. By drilling into or through the PCB at the locations marked with an "X", the inductance or resistance of the particular trace 102–108 is changed.

Figure 10A:
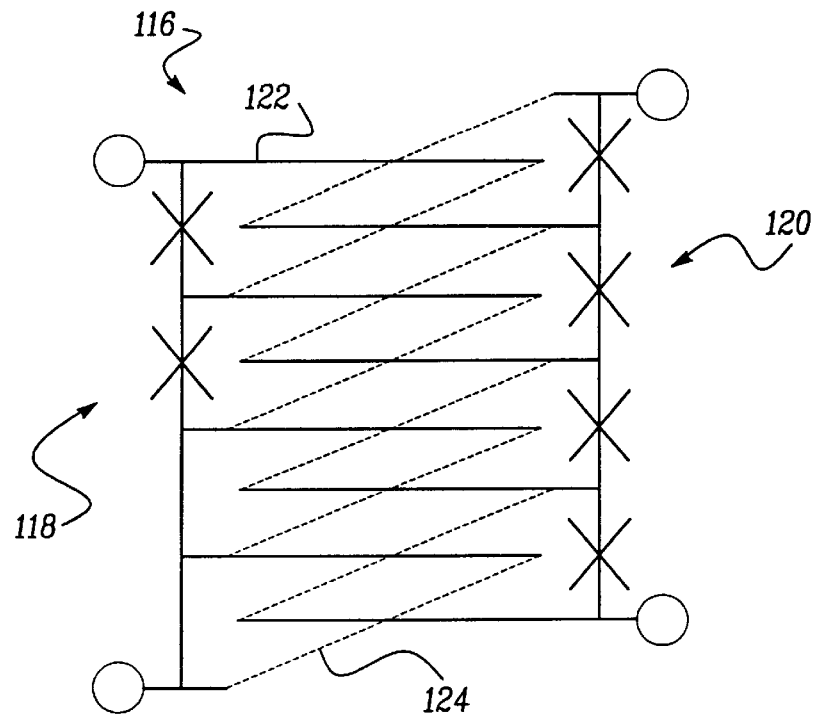
FIGS. 10(a)–10(b) show transformers on a PCB that can be electrically altered by drilling through the PCB at certain locations.

FIG. 10(a) shows a transformer 116 on a PCB that includes a primary winding 118 and a secondary winding 120 made up of traces 122 on the PCB. Dashed lines 124 are traces on a bottom side of the PCB. By drilling through the traces 122 at some or all of the locations marked "X", some of the windings can be removed from the primary winding 118 and/or the secondary winding 120 to effect the electrical performance of the transformer 116.

Figure 10B:
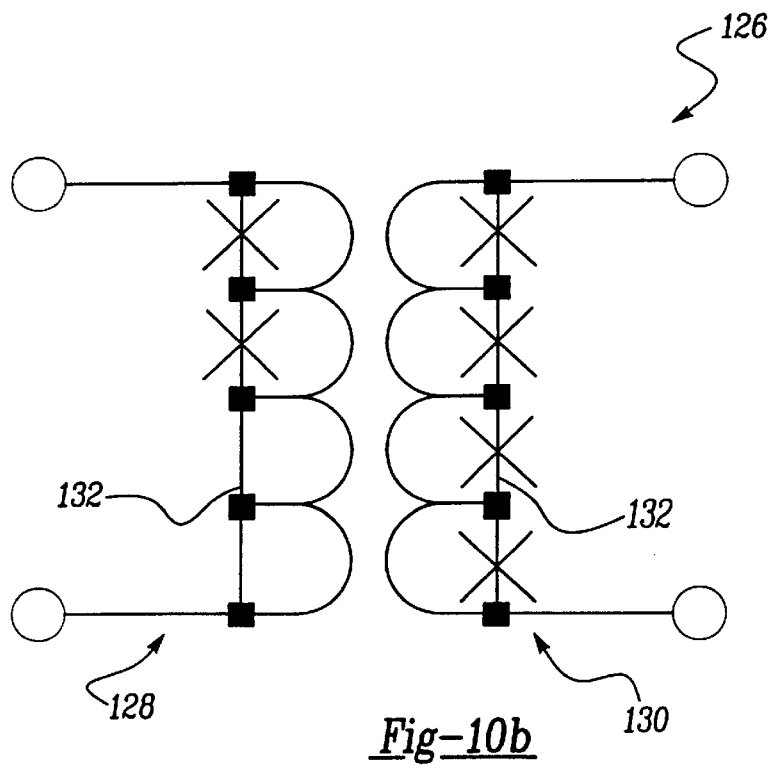

FIG. 10(b) shows a schematic representation of a 2:4 turns-ratio transformer 126 including a primary winding 128 and a secondary winding 130. The windings 128 and 130 are shorted by winding shunts 132. Removing one or more of the shunts 132 by drilling at the locations marked "X," the electrical performance of the transformer 126 can be changed.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An electrical circuit comprising:
    a plurality of discrete electrical components mounted on a printed circuit board, said printed circuit board including a first conductive plane formed on one side of a dielectric substrate and a second conductive plane formed on an opposite side of the substrate; and
    a tunable PCB component formed from a section of the printed circuit board, said tunable PCB component being formed from a section of one or both of the first conductive plane and the second conductive plane.

2. The circuit according to claim 1 wherein the PCB component is selected from the group consisting of capacitors, inductors, antennas, resistors, transmission lines, transformers, and connectivity matrixes.

3. The circuit according to claim 1 wherein the PCB component is a tunable capacitor formed from opposing sections of the first and second conductive planes.

4. The circuit according to claim 1 wherein said PCB component is tunable by trimming one or both of the first and second conductive planes.

5. An electrical circuit comprising:
    a plurality of discrete electrical components mounted on a printed circuit board, said printed circuit board including a first conductive plane formed on one side of a dielectric substrate and a second conductive plane formed on an opposite side of the substrate; and
    a PCB component formed from a section of the printed circuit board, said component being formed from a section of one or both of the first conductive plane and the second conductive plane, wherein the discrete components and the PCB component make up an oscillator circuit, said PCB component being a tuning capacitor of the oscillator circuit.

6. The circuit according to claim 3 wherein said tunable capacitor is tunable by trimming one or both of the first and second conductive planes.

* * * * *